United States Patent [19]
Shimizu et al.

[11] 3,939,424
[45] Feb. 17, 1976

[54] RADIO RECEIVER WITH A PHASE LOCKED LOOP FOR A DEMODULATOR

[75] Inventors: Ikuo Shimizu; Masakatsu Toyoshima, both of Tokyo, Japan

[73] Assignee: Sony Corporation, Tokyo, Japan

[22] Filed: Sept. 4, 1974

[21] Appl. No.: 503,100

[30] Foreign Application Priority Data
Sept. 8, 1973  Japan.............................. 48-101480
Sept. 10, 1973 Japan.............................. 48-101893

[52] U.S. Cl................................ 325/346; 325/423
[51] Int. Cl.².......................................... H04B 1/26
[58] Field of Search ........... 325/344, 346, 416, 417; 329/50, 122, 128, 124, 131

[56] References Cited
UNITED STATES PATENTS
3,069,625  12/1962  Morita et al..................... 325/346 X
3,209,271  9/1965  Smith................................. 329/122
3,231,822  1/1966  Tillotson........................... 325/346

*Primary Examiner*—Benedict V. Safourek
*Attorney, Agent, or Firm*—Lewis H. Eslinger; Alvin Sinderbrand

[57] ABSTRACT

A radio receiver with a phase-locked loop demodulator is described. The phase-locked loop includes a phase comparator, a variable frequency (voltage-controlled) oscillator, and a low pass filter. The capture range and lock range of the phase-locked loop are controlled in response to the tuning of the loop. In an AM receiver with a phase-locked loop the variable frequency oscillator of the loop supplies a reference carrier for a synchronous detector which is phase-locked to a modulated carrier. A band pass filter eliminates undesired modulation of the variable frequency oscillator by an undesired received signal.

7 Claims, 7 Drawing Figures

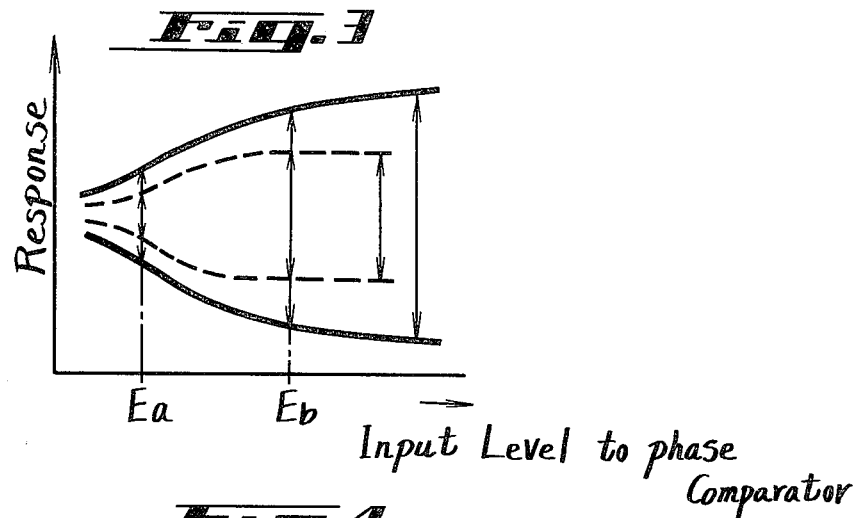
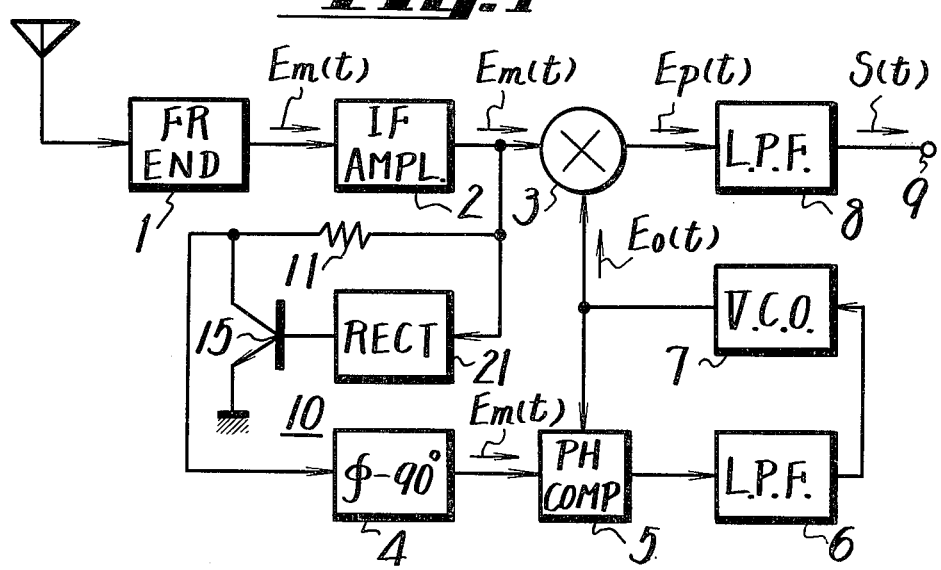
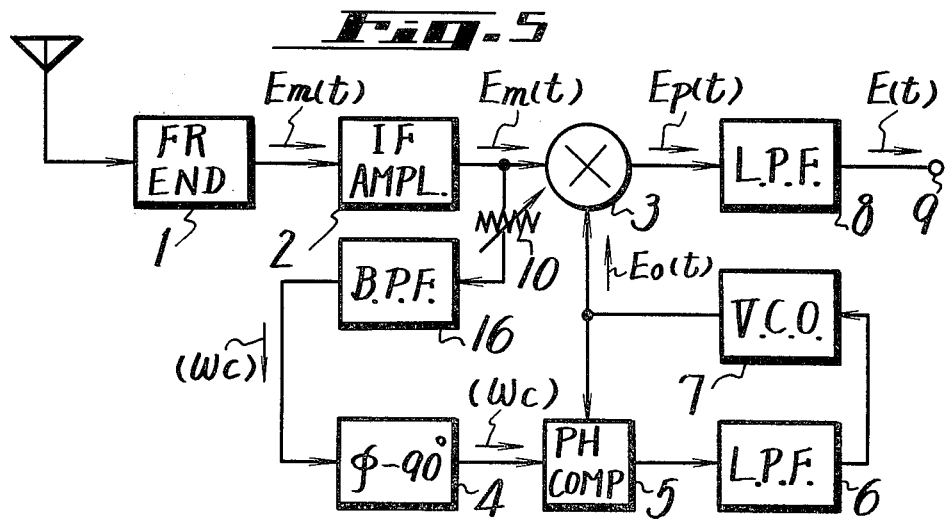

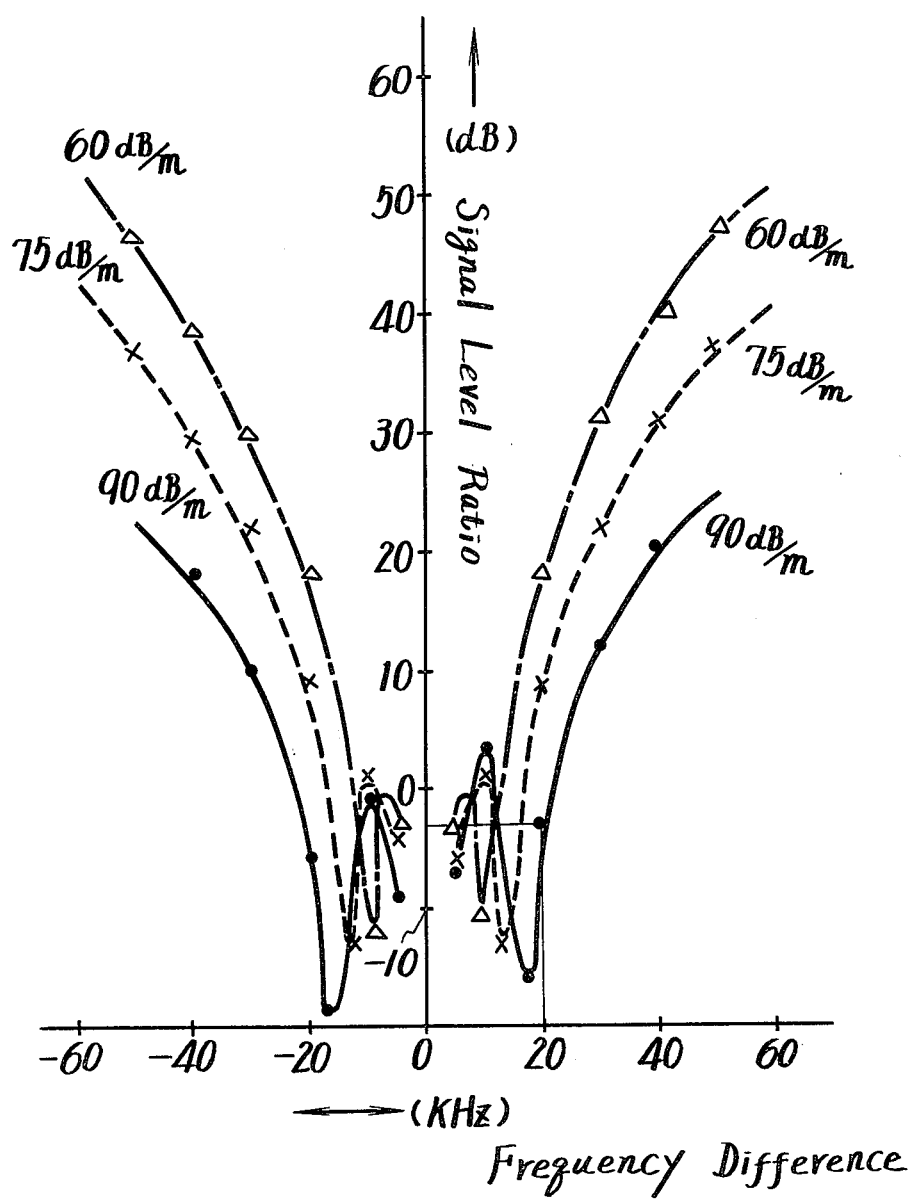

RADIO RECEIVER WITH A PHASE LOCKED LOOP FOR A DEMODULATOR

BACKGROUND OF THE INVENTION

1. Field of the Invention

The present invention relates generally to a radio receiver with a phase-locked loop (PLL) for a demodulator and, more particularly, to a radio receiver with a phase-locked loop demodulator in which a desired signal is easily tuned even in the presence of an adjacent undesired signal with high electric field intensity during a tuning operation.

2. The Prior Art

There has been proposed in the art a radio receiver with a phase-locked loop as a demodulator. However, generally speaking, since a voltage-controlled oscillator (VCO) used in the phase-locked loop is changed in accordance with fluctuations of ambient temperature and source voltage, in order to perform stable reception of signals, the lock range, which is the frequency range at which the phase lock of the phase-locked loop is released by a shift of the frequency of an input signal after the phase-locked loop has been phase locked to an input signal, must be relatively wide. However, there is a proportional relationship between the lock range and the capture range, which is the frequency range at which the voltage controlled oscillator of the phase-locked loop is captured by the frequency of the input signal from its free-running frequency, so that if the lock range is wide, the capture range is also wide.

Generally speaking, if an undesired radio-frequency signal with high electric field intensity is too close in frequency to a desired signal that is supposed to be selected by a radio receiver, it is difficult to detect the desired signal. In a radio receiver in which a phase-locking loop is used as a demodulator, the phase-locking loop may be locked to the undesired, or jamming signal that has a high electric field intensity, thereby preventing reception of the desired signal by the receiver. This often occurs in the case of a phase-locked loop with a wide capture range.

Further, it is noted that in a radio receiver that uses a phase-locked loop as a demodulator, the voltage controlled oscillator of the phase-locked loop is subjected to a modulation operation by a beat component between a desired signal and a jamming signal. As a result, the modulated carrier or component is demodulated by the demodulator and adversely affects the signal-to-noise (S/N) ratio of the audio output signal. This is generally referred to as two-signal jamming characteristics. For example, if the desired selected signal having an angular frequency of $\omega_c$ from the intermediate frequency amplifier circuit of a radio receiver contains a crosstalk signal with an angular frequency of $\omega_x$, the output signal from the phase comparator circuit of the phase-locked loop will include beat components with angular frequencies of $\omega_c + \omega_x$ and $\omega_c - \omega_x$. In this case, the beat component with the angular frequency of $\omega_c + \omega_x$ is eliminated by a low-pass filter in the phase-locked loop, but the beat component with the angular frequency of $\omega_c - \omega_x$ is not eliminated by the low-pass filter and is applied to the voltage controlled oscillator as a control signal. As a result, the oscillation frequency of the voltage controlled oscillator is subjected to frequency-modulation operation by the beat component of $\omega_c - \omega_x$. Thus, the voltage controlled oscillator may produce signal components with angular frequencies of $\omega_c + (\omega_c - \omega_x)$, $\omega_c - (\omega_c - \omega_x)$ and so on in addition to the necessary oscillation signal with an angular frequency of $\omega_c$. These signal components are applied to the synchronous detector circuit of an AM demodulator and hence the crosstalk signal is demodulated or the demodulated signal from the crosstalk signal is contained in a demodulated signal as a whole to deteriorate the two-signal jamming characteristics.

To reduce such a defect, it is sufficient to narrow the pass band of the IF amplifier, but this causes the high frequency component of the demodulated signal to be attenuated, which deteriorates the reproduced sound.

SUMMARY OF THE INVENTION

An object of the present invention is to provide a radio receiver with a phase-locked loop demodulator free from the above defects of the prior art.

Another object of the invention is to provide a receiver with a phase-locked loop for a demodulator in which the capture range and lock range of the phase-locked loop are so controlled that the receiver can be tuned to a selected low level signal even in the presence of a jamming signal with high field intensity.

A further object of the invention is to provide a receiver with a phase-locked loop for a demodulator in which the capture range and lock range of the phase-locked loop can be made small during a tuning operation, and both the ranges are increased after the tuning operation is finished to achieve the same easily and to produce an output signal with good S/N ratio.

A still further object of the invention is to provide a receiver with a phase-locked loop for a synchronous demodulator in which the capture range and lock range of the phase-locked loop are controlled in accordance with a tuning operation and the voltage controlled oscillator of the phase-locked loop is prevented from being undesirably modulated by a jamming signal.

The other objects, features, and advantages of the invention will become apparent from the following description taken in conjuction with the accompanying drawings.

BRIEF DESCRIPTION OF THE DRAWINGS

FIGS. 2 and 4 are block diagrams showing other embodiments of the invention, respectively.

FIG. 3 is a graph showing characteristics of a phase-locked loop used in the invention.

FIG. 5 is a block diagram showing a further embodiment of the invention.

FIGS. 6 and 7 are graphs used for the explanation thereof.

DESCRIPTION OF THE PREFERRED EMBODIMENTS

Figure 1:
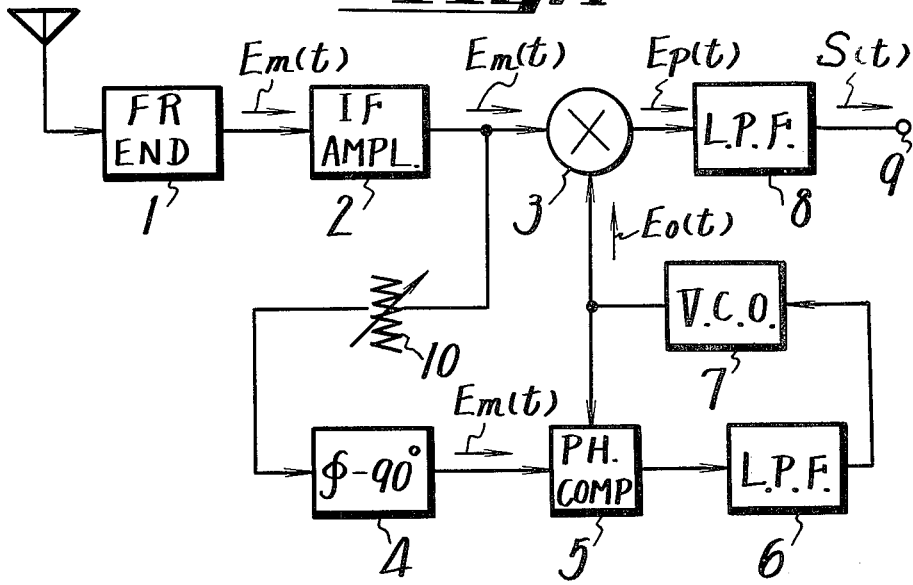
FIG. 1 is a block diagram showing an embodiment of the present invention.

Before describing the present invention, a fundamental construction of an AM demodulator will be now described as an example of a phase-locked loop which may be used in a radio receiver of the invention as a demodulator circuit. If it is assumed that a carrier signal is represented mathematically by $Ac \cos(\omega_c t + \theta c)$ and a demodulation carrier signal $S(t)$, an AM modulated carrier signal $Em(t)$ is expressed as follows:

$$Em(t) = Ac[1 + S(t)] \cos(\omega_c t + \theta c) \qquad (1)$$

If a certain signal $Eo(t)$ is represented by:

$$E_o(t) = A_o \cos(\omega_o t + \theta_o) \qquad (2)$$

the product $Ep(t)$ of the signals $Eo(t)$ and $Em(t)$ is expressed as follows:

$$Ep(t) = Eo(t) \times Em(t) = \tfrac{1}{2} AcAo[1 + S(t)][\cos\{(\omega_c + \omega_o)t + \theta_c + \theta_o\} + \cos\{(\omega_c - \omega_o)t + \theta_c - \theta_o\}] \qquad (3)$$

If it is assumed that $\Omega_o = \Omega_c$, the following equation (4) can be obtained.

$$Ep(t) = \tfrac{1}{2} AcAo[1 + S(t)]\cos(2\omega_c t + \theta_c + \theta_o) + \tfrac{1}{2} AcAo \cos(\theta_c - \theta_o) + \tfrac{1}{2} AcAo\, S(t) \cos(\theta_c - \theta_o) \qquad (4)$$

In equation (4), the first term is an AM modulated signal component with an angular frequency of $2\omega_c$, the second term is a DC signal component and the third term is a component of the original modulated signal $S(t)$.

If the signal $Ep(t)$ is applied to a low pass filter to eliminate its first and second signal components, the output signal $Ep(t)$ from the low pass filter is expressed by the following equation (5).

$$Ep(t) = \tfrac{1}{2} AcAo\, S(t) \cos(\theta_c - \theta_o) = k \cdot S(t) \qquad (5)$$

where $k = \tfrac{1}{2} AcAo \cos(\theta_c - \theta_o)$. That is, the original modulated signal $S(t)$ can be derived from the low pass filter, if the factor $k$ is constant. In other words, if the AM modulation signal $Em(t)$ is multiplied by the signal $Eo(t)$ which has an angular frequency equal to $\omega_c$ of the former and has the same phase, and the product signal $Ep(t)$ is applied to the low pass filter, the original modulated signal $S(t)$ can be demodulated.

FIG. 1 shows an embodiment of the radio receiver which, in accordance with the invention, achieves the above mentioned demodulation. With the embodiment shown in FIG. 1, an IF signal $Em(t)$ is derived from the receiver input circuit 1, which includes an RF amplifier and a mixer, and is then applied through a relatively wide band IF amplifier 2 to a multiplier 3 and to a phase comparator 5 through a phase shifter 4 for phase adjustment. The phase comparator 5 together with a low pass filter 6 and a voltage controlled oscillator 7 form a phase-locked loop. That is, the signal $Em(t)$ is applied to the phase comparator 5 through the phase shifter 4 and an output signal from the voltage controlled oscillator 7 is also applied to the phase comparator 5. The comparator 5 compares the phase of the applied signals and applies an output signal through the low pass filter 6 to the oscillator 7 as a control signal for the oscillator. Thus, the voltage controlled oscillator 7 produces an oscillation signal which has the same frequency as the signal $Em(t)$ from the phase shifter 4, that is, the signal $Eo(t)$. The signal $Eo(t)$ is applied to the multiplier 3 which then produces the signal $Ep(t)$ which is the product of the signals $Em(t)$ and $Eo(t)$. This signal $Ep(t)$ is applied to a low pass filter 8 which delivers the original signal $S(t)$ to an output terminal 9. In the illustrated embodiment of the invention, a control 10 is provided between the IF amplifier 2 and the phase shifter 4 for controlling the level of the input signal (modulated signal) in accordance with a tuning operation.

Figure 2:
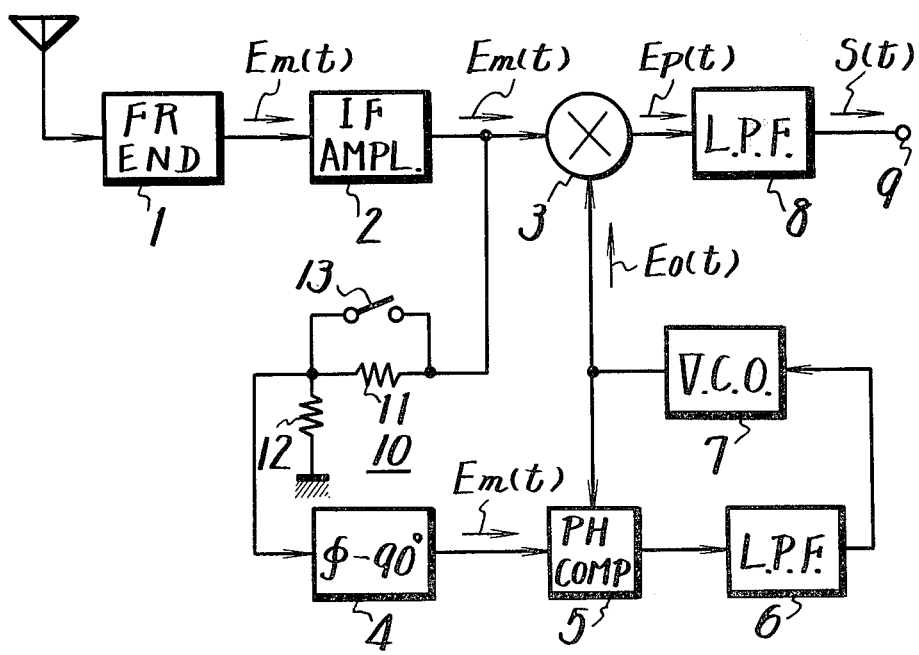

Another embodiment of of the invention is shown in FIG. 2 in which parts corresponding to those of FIG. 1 are identified by corresponding reference numerals. In the embodiment of FIG. 2, the control 10 is a variable attenuator which is inserted in to path of the signal $Em(t)$ between the IF amplifier 2 and the phase shifter 4 or the phase comparator 5. This variable attenuator includes a resistor 11 connected in series between the output terminal of the IF amplifier 2 and the input terminal of the phase shifter 4. The attenuator also includes a resistor 12 connected between the input terminal of the phase shifter 4 and ground, and a switch 13 connected in parallel with the resistor 11.

In the embodiment in FIG. 2, when a tuning operation is carried out, the switch 13 is opened, as shown. Thus, the level of the signal $Em(t)$ applied from the IF amplifier 2 to the phase shifter 4 or phase comparator 5 is attenuated by the resistors 11 and 12. Accordingly, both the capture range and the lock range are narrowed. The capture range represents a frequency range in which the oscillation frequency of the voltage controlled oscillator 7 is brought into synchronous operation by an input signal to the phase comparator 5, and the lock range represents a frequency range in which the phase-locked loop remains phase-locked, but outside of which it is released from the locked condition. Accordingly, by narrowing the ranges by means of the attenuator 10, it is possible, even in the case where two broadcasting signals are present in close frequencies, for a low level broadcasting signal to be received without having control of the voltage-controlled oscillator 7 captured by a high level broadcasting signal. Further, since the capture range is narrowed, the tuning operation is achieved at a correct tuning point.

After the tuning operation has been carried out, the switch 13 is closed. Then, the signal $Em(t)$ will no longer be attenuated by the resistors 11 and 12 in level but will be applied to the phase shifter 4 at its original amplitude. Such level shown by $Eb$ in FIG. 3. As a result, the lock range will be wide again, and hence the broadcasting signal to which the circuit is locked can be stably received even if the local oscillation frequency is changed. In other words, the tuning operation can be correctly carried out without having to exercise extreme care in operating the tuning control in the input, or front end, circuit 1, and the reception after the tuning operation will be stable. In addition, the circuit for achieving this result is simple in construction and is inexpensive.

FIG. 4 shows a further embodiment of the invention in which the reference numerals corresponding to those used in FIGS. 1 and 2 indicate the corresponding elements. In the embodiment of FIG. 4, in place of the resistor 12 shown in FIG. 2, the collector-emitter of a transistor 15, which is one type of variable impedance element, is used, and a rectifier circuit 21 is connected between the IF amplifier 2 and the base of the transistor 15. The rectifier 21 receives the signal $Em(t)$ from the IF amplifier 2 and produces an output signal with a low level when the signal $Em(t)$ has a high level. Conversely, the output signal of the rectifier has a high level when the signal $Em(t)$ has a low level. The output signal of the rectifier 21 is applied to the base of the transistor 15.

With the embodiment shown in FIG. 4, since the level of the signal $Em(t)$ is zero or low when the receiver is not tuned to an incoming signal but is undergoing a tuning operation, the level of the output signal from the rectifier 21 will be high and hence the impedance between the collector and emitter of the transistor 15 will be low. As a result, the level of the signal $Em(t)$ applied through the resistor 11 to the phase shifter 4 will be high and the capture range will be narrow. Thus, the tuning operation can be performed easily and accurately. On the other hand, when a signal is tuned in, the level of the signal $Em(t)$ will become high and the level of the output signal from the rectifier 21 will become low, causing the impedance between the collector and emitter of the transistor 15 to become high and the level of the signal E$m(t)$ applied through the resistor 11 to the phase shifter 4 to be kept high with the result that the lock range becomes wide and, consequently, the signal reception is stable.

The impedance between the collector and emitter of the transistor 15 is controlled in response to the level of the signal E$m(t)$ from the IF amplifier 2 and hence the level of the signal E$m(t)$ applied to the phase shifter 4 is made substantially constant regardless of the level of the received signal. As a result, the capture range becomes substantially constant and the tuning control in the front end circuit 1 is easier to use.

In place of the circuits 1 and 2 a high frequency amplified circuit and a tuning circuit may be provided to apply a high frequency signal to the multiplier 3 and the attenuator 10 and to apply a bias voltage with a level in response to a received frequency to the oscillator 7 as its control signal, thereby making the oscillation center frequency coincide with the received frequency.

A further embodiment of the invention will be described with reference to FIG. 5 in which the elements corresponding to those used in FIGS. 1, 2, and 4 are identified by corresponding reference numerals. In the embodiment of FIG. 5 a band pass filter 16 is connected in the signal path of the signal E$m(t)$ between the IF amplifier 2 and the phase shifter 4 or the phase comparator 5. The filter 16 has a narrow pass band which may permit a signal with an angular frequency $\omega_c$ to pass through.

With the embodiment of FIG. 5, even if a crosstalk signal component (beat component) is contained in the signal E$m(t)$ from the IF amplifier 2, the phase comparator 5 is supplied by the band pass filter 16 with only a carrier component of the angular frequency $\omega_c$. As a result, the oscillator 7 produces only the signal E$o(t)$ with the angular frequency $\omega_c$ to be applied to the multiplier 3. Thus, even if some crosstalk component is contained in the signal E$m(t)$ applied from the IF amplifier 2 to the multiplier 3, this crosstalk component is not demodulated with the signal E$o(t)$. As a result, the signal S$(t)$ obtained at the terminal 9 is free from crosstalk.

Thus, it will be apparent that when the band pass filter 16 is provided, as in the case of FIG. 5, demodulation without crosstalk is carried out. In addition, if the band of the IF amplifier 2 is made wide, the band of the signal E$m(t)$ applied from the IF amplifier 2 to the multiplier 3 is not limited and hence the high frequency component of the demodulated signal S$(t)$ is not attenuated so that the sounds are not deteriorated. Since only the band pass filter 16 is added for this purpose, the construction is rather simple and inexpensive.

Figure 7:
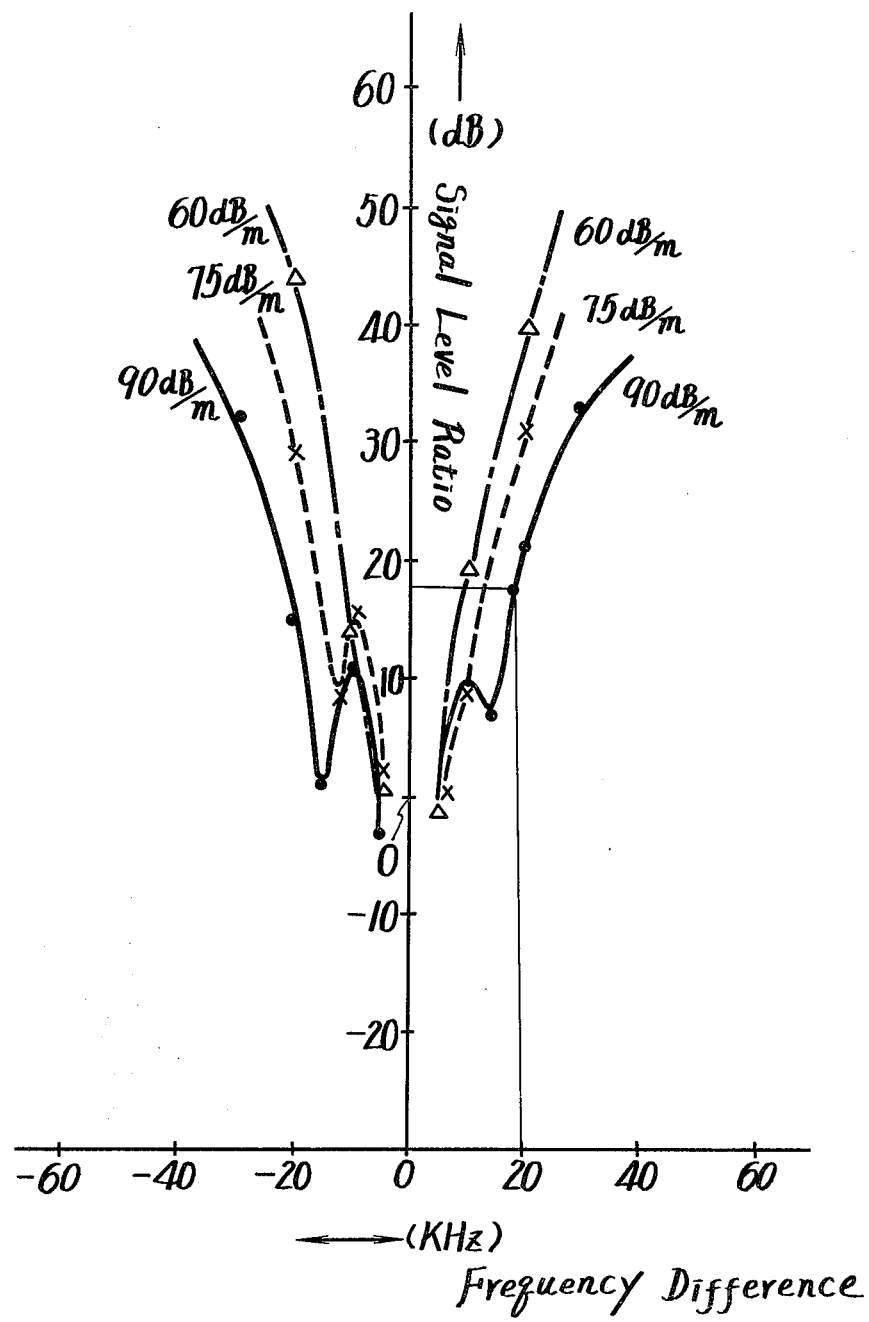

FIGS. 6 and 7 are graphs showing measured two-signal jamming, or interference, characteristics. The graph of FIG. 6 shows the circuit response when the band pass filter 16 is not used, while the graph of FIG. 7 shows the case when the band pass filter 16 is used. The graphs show the result which is measured as follows: Firstly, the modulated desired signal E$m(t)$ is applied with a predetermined amplitude or level (for example, 90dB/m) and the level of the signal S$(t)$ at that time is taken as a reference level (0dB in the ordinate of the graphs). The input level of the signal E$m(t)$ is chosen for the parameters (60, 75 and 90db) in the graphs. Next, the modulation of the signal E$m(t)$ is cut off and then the modulated jamming signal is applied. The frequency difference between the jamming signal and the signal E$m(t)$ at this time is shown on the abscissa of the graph in KHz. The input level of the jamming signal is adjusted so as to lower the demodulated level of the jamming signal by a certain S/N ratio (in the illustrated graph, −30dB). The ratio between the input level of the jamming signal and the input level (90dB/m) of the desired signal at this time is plotted for the ordinate. Thus, the graphs shown in FIGS. 6 and 7 are obtained.

By way of example, in the graph of FIG. 6, if the input level of the desired signal E$m(t)$ is 90dB/m and the frequency of the jamming signal is +20KHz, the input level of the jamming signal is smaller than that of the desired signal E$m(t)$ by 3dB. Accordingly, the input level of the jamming signal is 87dB/m in this case. In other words, if the band pass filter 16 is not provided, when the input level of the desired signal E$m(t)$ is 90dB/m, the S/N ratio of 30dB is obtained even if the input level of the jamming signal separated from the desired frequency by only +20KHz is 87dB/m.

However, if the band pass filter 16 is provided, it is apparent from the graph of FIG. 7 that when the input level of the desired signal E$m(t)$ is 90dB/m, the S/N ratio of 30dB is obtained, even if the input level of the jamming signal separated from the desired frequency by only +20KHz increases to 117dB/m. Including the band pass filter 16 in the circuit imprives the characteristics by 26dB/m. That is, when the band pass filter 16 is employed, the two-signal interference characteristics are improved much, and the high frequency component of the demodulated signal S$(t)$ is not deteriorate, and yet the circuit still is of simple construction.

If a band pass filter similar to the filter 16 is inserted in the signal path of the signal E$o(t)$ between the oscillator 7 and the phase comparator 5, the two-signal interference characteristics can be improved still further.

It may be obvious that many modifications and variations could be effected by those skilled in the art without departing from the spirits and scope of the novel concepts of the present invention.

We claim:

1. A radio receiver with a phase-locked loop for a demodulator, said receiver comprising:
   A. means for receiving a plurality of modulated carrier signals;
   B. means for tuning to a predetermined one of the modulated carrier signals;
   C. means for demodulating the predetermined carrier signal from said tuning means, said demodulating means comprising a phase-locked loop which includes a phase comparator, a low pass filter receiving the output from said comparator to provide a control voltage and a variable oscillator controllable by said control voltage, said phase comparator receiving said predetermined modulated carrier signal and the output signal of said variable oscillator, and means for synchronously detecting the output signal of said variable oscillator with said predetermined modulated carrier signal to produce a demodulated signal; and
   D. means for controlling the amplitude of the predetermined modulated carrier signal received by said phase comparator in such a way that the capture range and lock range of said phase-locked loop are controlled in response to the tuning operation of said tuning means.

2. A radio receiver with a phase-locked loop for a demodulator according to claim 1, wherein said controlling means comprises an attenuator to reduce the amplitude of the predetermined modulated carrier signal, as received by said phase comparator, when said tuning means is being tuned and to increase the amplitude of the modulated carrier signal, as received by said phase comparator, after said tuning means has been tuned to the predetermined modulated carrier signal.

3. A radio receiver with a phase-locked loop for a demodulator comprising:
   A. means for receiving a plurality of modulated carrier signals;
   B. means for tuning to a predetermined one of the modulated carrier signals;
   C. synchronous detecting means comprising a multiplier circuit and a low pass filter receiving the output of said multiplier circuit for demodulating an audio output signal from the predetermined modulated carrier signal in accordance with the product of the modulated carrier signal and a reference carrier signal;
   D. a phase locked loop including a phase comparator, a low pass filter receiving the output from said comparator to provide a control voltage and a variable oscillator controllable by said control voltage for producing said reference carrier signal, said phase comparator receiving said predetermined modulated carrier signal and said reference carrier signal from the variable oscillator so that the reference carrier signal is phase-locked to the center frequency of said predetermined modulated carrier signal; and
   E. means for controlling the amplitude of the predetermined modulated carrier signal, as received by said phase comparator, to control the capture range and lock range of the phase-locked loop in response to the tuning operation of said tuning means.

4. A radio receiver with a phase-locked loop for a demodulator according to claim 3, wherein said controlling means comprises an attenuator to reduce the amplitude of the predetermined modulated carrier signal, as received by said phase comparator, when said tuning means is being tuned, and to increase the amplitude of the predetermined modulated carrier signal, as received by said phase comparator, after the tuning operation has been performed.

5. A radio receiver with a phase-locked loop for a demodulator according to claim 3, wherein said means for controlling the amplitude of the predetermined modulated carrier signal, as received by said phase comparator, comprises a rectifier to rectify the predetermined modulated carrier signal, and signal level control means controlled by the rectified signal from said rectifier.

6. A radio receiver with a phase-locked loop for a demodulator according to claim 3, further comprising a band pass filter through which said modulated carrier signal is supplied to said phase comparator, said band pass filter being tuned in respect to an undesirable modulated signal to prevent said undesirable signal from being supplied to said variable oscillator.

7. A radio receiver with a phase-locked loop for a demodulator according to claim 2, in which said modulated carrier signals are AM signals, and said means for synchronously detecting includes multiplying means for multiplying said predetermined modulated carrier signal by said output signal of the variable oscillator, and low pass filter means receiving the output of said multiplying means and passing only said demodulated signal therein.

* * * * *